(12) United States Patent
Hsu et al.

(10) Patent No.: US 7,384,837 B2
(45) Date of Patent: Jun. 10, 2008

(54) METHOD FOR ISOLATING SILICON GERMANIUM DISLOCATION REGIONS IN STRAINED-SILICON CMOS APPLICATIONS

(75) Inventors: Sheng Teng Hsu, Camas, WA (US);
Jong-Jan Lee, Camas, WA (US);
Douglas J. Tweet, Camas, WA (US);
Jer-shen Maa, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 312 days.

(21) Appl. No.: 11/073,185

(22) Filed: Mar. 3, 2005

(65) Prior Publication Data
US 2005/0151134 A1    Jul. 14, 2005

Related U.S. Application Data

(62) Division of application No. 10/345,551, filed on Jan. 15, 2003, now Pat. No. 6,903,384.

(51) Int. Cl.
*H01L 21/8238*    (2006.01)
(52) U.S. Cl. ............... 438/199; 438/221; 438/222; 438/285; 257/E21.092
(58) Field of Classification Search ............... 438/199, 438/221, 222, 285; 257/E21.092, E21.371
See application file for complete search history.

(56) References Cited
U.S. PATENT DOCUMENTS 6,339,232 B1 * 1/2002 Takagi ..................... 257/192
6,399,970 B2 * 6/2002 Kubo et al. ................ 257/194
6,464,780 B1 * 10/2002 Mantl et al. ................ 117/90
6,492,216 B1 * 12/2002 Yeo et al. ................... 438/197
6,562,703 B1 * 5/2003 Maa et al. ................... 438/518
6,815,707 B2 * 11/2004 Sugii et al. ................. 257/19
6,841,457 B2 * 1/2005 Bedell et al. ............... 438/479
6,974,735 B2 * 12/2005 Fitzgerald ................... 438/197
7,122,449 B2 * 10/2006 Langdo et al. ............. 438/481
7,138,310 B2 * 11/2006 Currie et al. ............... 438/199

(Continued)

OTHER PUBLICATIONS

Wolf, Stanley. Silicon Processing for the VLSI Era vol. 2: Process Integration. California: Lattice Press, 1990. pp. 45-47, 196.*

(Continued)

*Primary Examiner*—Minh-Loan T Tran
(74) *Attorney, Agent, or Firm*—Law Office of Gerald Maliszewski; Gerald Maliszewski

(57) ABSTRACT

A dual gate strained-Si MOSFET with thin SiGe dislocation regions and a method for fabricating the same are provided. The method forms a first layer of relaxed SiGe overlying a substrate, having a thickness of less than 5000 Å; forms a second layer of relaxed SiGe overlying the substrate and adjacent to the first layer of SiGe, having a thickness of less than 5000 Å; forms a layer of strained-Si overlying the first and second SiGe layers; forms a shallow trench isolation region interposed between the first SiGe layer and the second SiGe layer; forms an p-well in the substrate and the overlying first layer of SiGe; forming forms a p-well in the substrate and the overlying second layer of SiGe; forms channel regions, in the strained-Si, and forms PMOS and NMOS transistor source and drain regions.

14 Claims, 3 Drawing Sheets

U.S. PATENT DOCUMENTS

2001/0003364 A1* 6/2001 Sugawara et al. .......... 257/192
2002/0125471 A1* 9/2002 Fitzgerald et al. ............ 257/19
2005/0136584 A1* 6/2005 Boyanov et al. ............ 438/199

OTHER PUBLICATIONS

Wolf, Stanley. "Silicon Processing for the VLSI Era vol. 2: Process Integration." California: Lattice Press, 1190. pp. 376-384.*

* cited by examiner

TO Fig. 5b

METHOD FOR ISOLATING SILICON GERMANIUM DISLOCATION REGIONS IN STRAINED-SILICON CMOS APPLICATIONS

RELATED APPLICATIONS

This application is a Divisional of a patent application entitled, SYSTEM AND METHOD FOR ISOLATING SILICON GERMANIUM DISLOCATION REGIONS IN STRAINED-SILICON CMOS APPLICATIONS, invented by Hsu et al., Ser. No. 10/345,551, filed Jan. 15, 2003 now U.S. Pat. No. 6,903,384.

BACKGROUND OF THE INVENTION

1. Field of the Invention

This invention generally relates to high-speed CMOS integrated circuit fabrication and, more particularly, to a system and method using a strained-silicon channel on silicon germanium for isolating silicon germanium regions of adjoining MOS structures.

2. Description of the Related Art

Silicon germanium (SiGe) materials can be represented with the nomenclature of $Si_{1-x}Ge_x$, where x is typically less than 1. Strained-silicon MOS transistors are fabricated with both surface channel and buried channel devices. For surface channel strained-silicon devices, strained-Si is deposited on top of a relaxed $Si_{1-x}Ge_x$ layer. For buried channel devices, a layer of strained-Si is interposed between relaxed $Si_{1-x}Ge_x$ layers. Conventionally, such devices use a thick layer of graded $Si_{1-x}Ge_x$, where x varies from 0 at the bottom, to about 0.3, or more at the top, with a thickness of 1 micron (μm) to 5 μm. A 1 μm to 2 μm layer of relaxed $Si_{1-x}Ge_x$ with a constant germanium concentration is grown on top of the graded $Si_{1-x}Ge_x$, followed by a strained-Silicon epitaxial layer. A 1 to 5 μm thick graded SiGe layer has many dislocations, so that a top layer of 1 to 2 μm thick relaxed SiGe, with a constant Ge concentration, can be grown. The strained-Silicon layer can be used for the surface channel of a MOS transistor. For buried channel MOS transistors, an additional layer of $Si_{1-x}Ge_x$ is deposited onto the strained-Silicon layer. The above-mentioned SiGe structures can have an enhanced field effective mobility, about 80% higher than that of pure silicon. For a PMOS transistor, an effective hole mobility of 400 cm²/Vs has been obtained. For CMOS, the well boundary may exceed the constant germanium concentration region and reach the graded semi-relaxed $Si_{1-x}Ge_x$ layer.

The defect density in both regions (graded SiGe and constant Ge regions) is high, causing large inter-well junction leakage current. In addition, the band gap of the $Si_{1-x}Ge_x$ is narrower than that of Si. The junction leakage current is proportional to the density of electron-hole generation centers multiplied by the intrinsic carrier density. Therefore, for a given electron-hole generation center density the junction leakage current is proportional to $\exp[(E_c-E_v)/2kT]$, where $(E_c-E_v)$ is the band gap. That is, for a given density of electron-hole generation center, a $Si_{1-x}Ge_x$ junction has a larger leakage current than a Si junction. The well leakage current of CMOS devices made with state-of-the-art graded relaxed $Si_{1-x}Ge_x$ material is very high. Low standby power devices cannot be fabricated with such a structure.

The electron-hole pair generation rate in a depletion region of a semiconductor is:

$$U = \frac{\sigma v_{th} N_t n_i}{2\cosh\left(\frac{E_i - E_t}{kT}\right)} = \frac{\sigma v_{th} N_t \sqrt{N_c N_v}}{2\cosh\left(\frac{E_i - E_t}{kT}\right)} e^{(E_c - E_v)/2kT}$$

where σ is the capture cross-section, $v_{th}$ is the thermal velocity, $N_t$ is the electron-hole generation center density, $n_i$ is the intrinsic carrier density, $N_c$ and $N_v$ are the state densities at the conduction band and the valence band, respectively, and $E_c$ and $E_v$ are the band edge energy of conduction band and valence band, respectively. $E_i=(E_c+E_v)/2$ and $E_t$ is the energy of the generation center. The most active generation center is located at $E_i$. Therefore, the generation current is approximately proportional to $N_t e^{(E_c-E_v)/2kT}$, where k is Boltzmann's constant and T is temperature. A generation center is usually associated with a defect state. It is well known that the defect density in a typical graded relaxed $Si_{1-x}Ge_x$ layer is larger than $1 \times 10^6/cm^8$. Therefore, the leakage current of a junction formed in either relaxed or strained-$Si_{1-x}Ge_x$ is large.

It would be advantageous if a CMOS device could be fabricated that had a high defect density, but with a low leakage current.

It would be advantageous if a low leakage current CMOS device could be fabricated using SiGe.

SUMMARY OF THE INVENTION

The present invention describes a low leakage current CMOS device that uses a strained-Si channel on a $Si_{1-x}Ge_x$ structure, and a method of fabricating such a device. The device uses shallow trench isolation (STI) to separate the high defect regions of adjoining complementary transistors.

Accordingly, a method is provided for forming thin SiGe dislocation regions in a dual gate MOSFET device. The method comprises: forming a silicon substrate; forming a first layer of relaxed SiGe overlying the substrate, having a thickness of less than 5000 Å; forming a second layer of relaxed SiGe overlying the substrate and adjacent to the first layer of SiGe, having a thickness of less than 5000 Å; forming a first layer of strained-Si overlying the first SiGe layer; forming a second layer of strained-Si overlying the second SiGe layer; forming a shallow trench isolation region interposed between the first SiGe layer and the second SiGe layer; forming an n-doped well (n-well) in the substrate and the overlying first-layer of SiGe; forming a p-doped well (p-well) in the substrate and the overlying second layer of SiGe; forming a PMOS gate overlying the first strained-Si layer; forming an NMOS gate overlying the second strained-Si layer; forming first and second channel regions, respectively, in the first and second layers of strained-Si, and from the strained-Si layers and a portion of the underlying SiGe layers, forming PMOS and NMOS transistor source and drain regions.

In some aspects of the method, forming a STI region interposed between the first SiGe layer and the second SiGe layer includes forming the STI region interposed between the first high defect region and the second high defect region. In other aspects, forming a STI region interposed between the first high defect region and the second high defect region includes forming the STI region interposed between the n-well and the p-well.

Some aspects of the method comprise: operating the device using conventional source, drain, and gate voltages; in response to the operation voltages, forming source/drain junctions and drain depletion regions extending into the first and second SiGe layers. Then, it can be stated that the first and second SiGe layers have a minimum thickness equal to the depth of the source/drain junctions plus the drain depletion region.

Additional details of the above-mentioned method, and a dual gate CMOSFET device with thin SiGe dislocation regions, are described below.

DETAILED DESCRIPTION OF THE PREFERRED EMBODIMENTS

Figure 1:
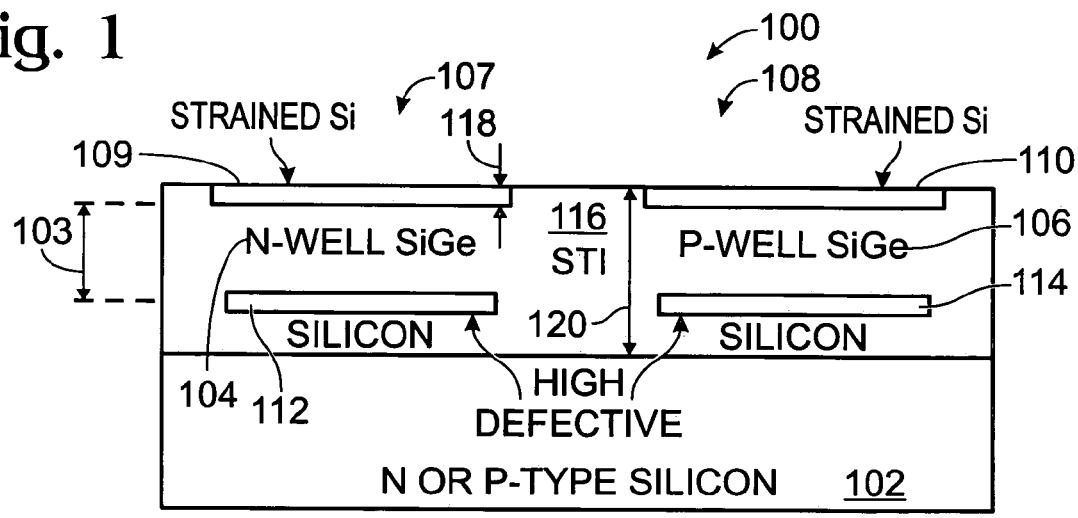
FIGS. 1 and 2 are partial cross-sectional views of the present invention dual gate CMOSFET device with thin SiGe dislocation regions in different stages of fabrication.
Figure 2:
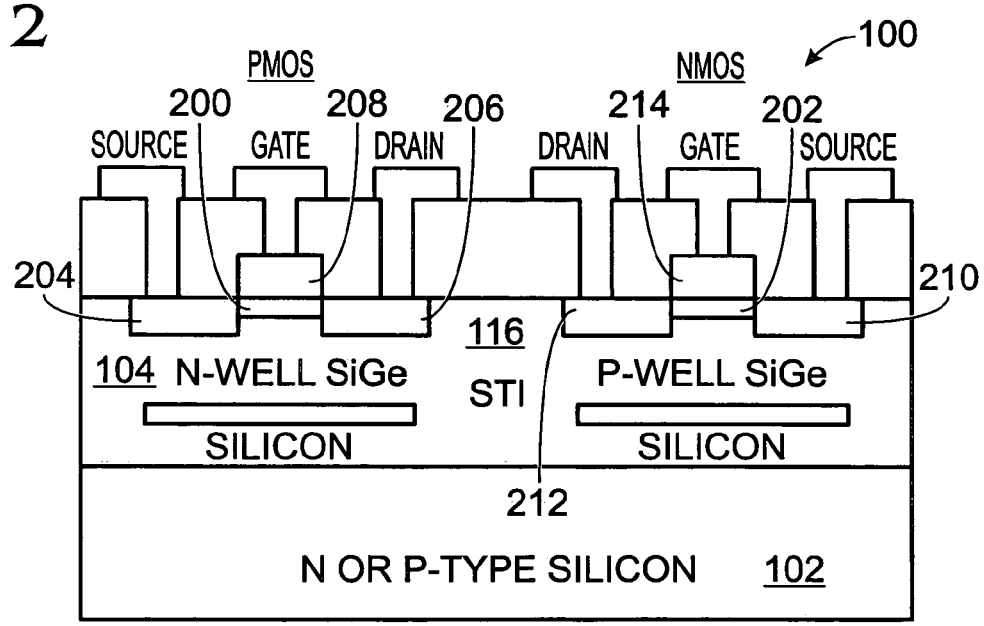

FIGS. 1 and 2 are partial cross-sectional views of the present invention dual gate CMOSFET device with thin SiGe dislocation regions in different stages of fabrication. Alternately stated, the dual gate CMOSFET is a MOSFET with complementary PMOS and NMOS structures. The CMOSFET 100 comprises a silicon substrate 102. The substrate 102 can be either N or P type silicon. A first layer of SiGe 104 overlies the substrate 102. The first layer of relaxed SiGe 104 has a thickness 103 of less than 5000 Å. Note that the thickness 103 may extend into the high defect region, as explained in more detail below. Likewise, a second layer of SiGe 106 overlies the substrate 102. The second layer of relaxed SiGe 106 is adjacent to the first layer of SiGe 104 and has a thickness 103 of less than 5000 Å. Note that the first and second layers of SiGe 104/106 are typically deposited (simultaneously) in the same process. Note that the first and second SiGe layers 104/106 are graded layers of $Si_{1-x}Ge_x$, where x can vary from 0 to 1. Also note that the percentage of Si to Ge may vary across the layer thickness. In some aspects of the invention, the first and second layers 104/106 of relaxed SiGe have a germanium content in the range of 10% to 50%. In other aspects, the Ge content is constant through the SiGe layers 104/106. As explained in more detail below, the first and second SiGe layers 104/106 are initially formed as strained-SiGe.

An n-doped well (n-well) 107 is formed in the substrate 102 and the overlying first SiGe layer 104. Likewise, a p-doped well (p-well) 108 is formed in the substrate 102 and the overlying second SiGe layer 106.

A first layer of strained-Si 109 overlies the first SiGe layer 104. Likewise, a second layer of strained-Si 110 overlies the second SiGe layer 106. Again, it is typical that the first and second strained-Si layers 109/110 are formed (simultaneously) in the same process.

Following the relaxation of the first and second SiGe layers 104/106, high defect regions 112 and 114 are formed between the respective SiGe layers and the underlying substrate. More specifically, a first high defect region 112 is formed between the first SiGe layer 104 and the underlying n-well silicon area. A second high defect region 114 is formed between the second SiGe layer 106 and the underlying p-well silicon area. It should be understood that n-well 107 includes both n-well SiGe and n-well silicon areas. Likewise, the p-well 108 includes both p-well SiGe and p-well silicon areas. Also note that the high defect regions 112 and 114 are formed from a combination of SiGe and underlying Si materials.

A shallow trench isolation (STI) region 116 is interposed between the first SiGe layer 104 and the second SiGe layer 106. More specifically, the STI region 116 is interposed between the first high defect region 112 and the second high defect region 114. Alternately, it can be stated that the STI region 116 is interposed between the n-well 107 and the p-well 108. Although not shown, in other aspects, the STI region 116 may extend through to the substrate 102, to completely separate the n-well 107 from the p-well 108. Expressed yet another way, the STI region 116 is formed to a depth 120 of 0.2 to 0.6 microns, where the depth is defined from the top of the strained-Si 200/202 to the bottom of the trench in which the STI 116 is formed.

The STI region 116 may be formed by oxidizing a silicon substrate. Alternately, the STI region 116 may be formed by trenching and filling region 116 with an isolation material such as an oxide or nitride compound. The present invention is not limited to any particular STI material or any particular STI formation process.

The first layer of strained-Si 109 has a thickness 118 of less than 300 Å. Likewise, the second layer of strained-Si 110 has a thickness 118 of less than 300 Å.

Referring now to FIG. 2, a first channel region 200 formed in the first layer of strained-Si. Likewise, a second channel region 202 is formed in the second layer of strained-Si. PMOS source 204 and drain 206 regions formed in the first strained-Si layer and a top portion of the underlying first SiGe layer 104. A PMOS gate 208 overlies the first channel region 200. NMOS source 210 and drain 212 regions are formed in the second strained-Si layer and a top portion of the underlying second SiGe layer 106. An NMOS gate 214 overlies the second channel region 202.

Figure 3:
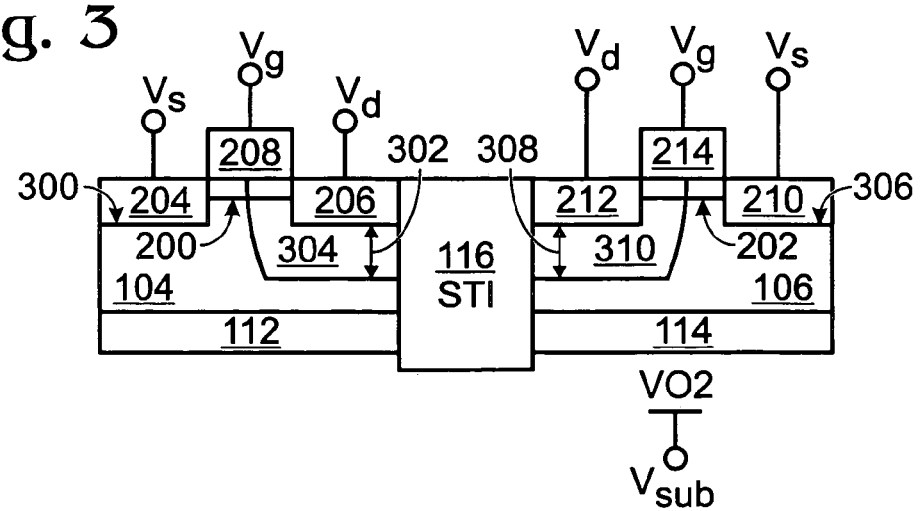
FIG. 3 is a partial cross-sectional view of the present invention MOSFET represented in an operational state.

FIG. 3 is a partial cross-sectional view of the present invention MOSFET represented in an operational state. Convention CMOS drain (Vd), source (Vs), gate (Vg), and substrate (Vsub) operation voltages are applied to the NMOS and PMOS devices. A source junction region 300 exists between the PMOS source 204 and the first SiGe layer 104. A drain junction region 302 exists between the PMOS drain 206 and the first SiGe layer 104. When operated with conventional source, drain, gate, and substrate voltages, drain depletion regions 304 extend into the first SiGe layer 104. Likewise, source/drain junction regions 306/308 are formed between the NMOS source/drain 210/212 and the second SiGe layer 106, with drain depletion regions 310 extending into the second SiGe layer 106. Then, it can be stated that the first and second SiGe layers 104/106 each have a minimum thickness 103 equal to the depth of the source/drain junctions plus the drain depletion region. Again, it should be understood that the high defect regions 112/114 includes both SiGe and Si areas, and that the minimum thickness 103 may include some, or all of the SiGe in the high defect regions 112/114. Using the PMOS as an example, thickness 103 is at least equal to the depth of the source junction 300, plus the drain depletion 304.

Functional Description

Figure 4:
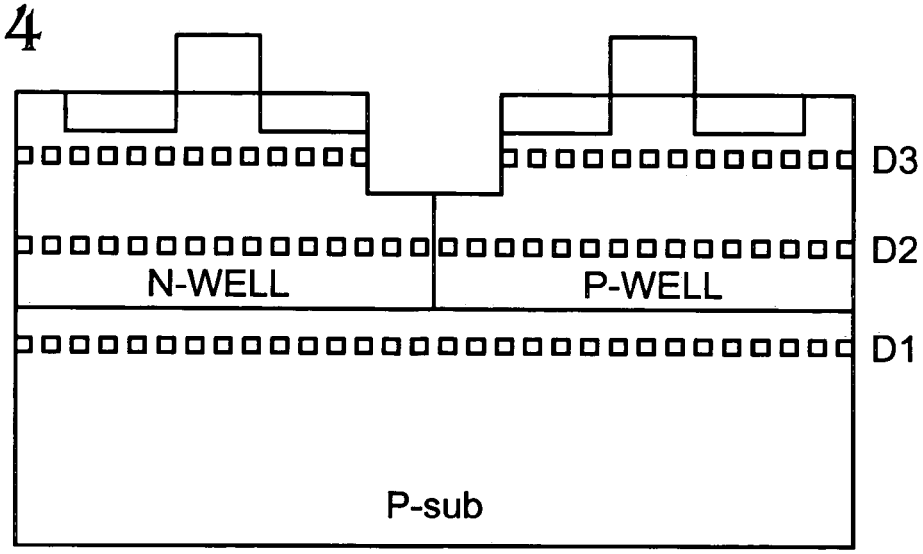
FIG. 4 is a partial cross-sectional view depicting potential dislocation regions.

FIG. 4 is a partial cross-sectional view depicting potential dislocation regions. As mentioned above, the relaxation of SiGe occurs in response to the generation of dislocations. The dislocations in the device act as generation/recombination centers. In the condition of a reverse biased PN junction, generation current occurs when there are crystalline defects, such as dislocations, in the depletion region. Defects may be placed at three different depths, as shown in FIG. 4. For depth D1, relaxed SiGe with a constant Ge concentration (0.3 for example) and low defect density (less than $1\times10^4/$ cm$^3$) needs to be grown to a thickness sufficient that the dislocations are not in the wells (n-well or p-well), or the well to substrate depletion region. The required thickness is approximately 2 microns. In addition, 1 to 5 microns of graded SiGe, where x varies from 0 at the bottom to about 0.3 or more at the top, with many dislocations is needed prior to the relaxed and low defect SiGe deposition. Therefore, the total SiGe thickness is in the range of 3 to 7 microns. The low defect density required (less than $1\times10^4/$ cm$^3$, where $1\times10^4$/cm$^3$ is the state-of-the-art) and thick SiGe growth pose both economical and technical challenges.

For the D2 depth, large generation current occurs at the p-well/n-well junctions. The high inter-well leakage current may short CMOS devices. For the D3 case, the depth (SiGe thickness) must be great enough to keep the dislocation region away from the S/D junctions, and the STI isolation must be deep enough to isolate the dislocation regions. The SiGe thickness, for the quarter micron (0.25 μm) technology generation, is about 0.3 μm. This layer can be grown using a Chemical Vapor Deposition (CVD) system or Molecular Beam Epitaxial (MBE) system with reasonable process times and costs. The STI depth is about 0.2-0.6 μm, which is similar to the quarter micron VLSI process technology. With the technology pushing into the sub 0.1 μm node, both SiGe and STI thicknesses can be further reduced because of the shallower source/drain junction and lower operating voltage that decreases the drain depletion region.

Using the D3 depth, the present invention process fabricates a low standby current CMOS circuit using a strained-silicon on relaxed $Si_{1-x}Ge_x$ substrate. A thin layer of strained-$Si_{1-x}Ge_x$ having Ge content of typically 10% to 50% (x=0.1 to 0.5) is grown onto a silicon single crystal substrate. The Ge content can be constant through the layer thickness, or graded. Grading permits a higher Ge content at the top of the layer. The $Si_{1-x}Ge_x$ layer is no thicker than 500 nm. The minimum thickness of this layer is equal to the depth of the source/drain junction plus the maximum depth of the drain depletion region. That is, at the maximum operation voltage, the drain depletion region does not reach the high defective region. The substrate can be either n-type or p-type silicon.

To produce the defect region, damage-producing ions are introduced, such as hydrogen ions (H+ or ionized atomic hydrogen), H2 (singly ionized molecular hydrogen), He+, or boron ions. For example, a heavy dose of hydrogen ions, in the order of $5\times10^{15}$/cm$^2$ to $4\times10^{16}$/cm$^2$, is implanted into the substrate with a projected depth of slightly deeper than the thickness of the strained-$Si_{1-x}Ge_x$ layer. Then, the structure is annealed at a temperature of 600° C. to 1000° C., for 1 to 60 minutes. This annealing process relaxes the strained-$Si_{1-x}Ge_x$ and creates a thin region of high defective density around the interface between the $Si_{1-x}Ge_x$ layer and the silicon substrate. Phosphorus and boron ions are implanted to form the n-well and p-well, respectively. The depth of the wells is deeper than that of the high defective region by at least 50 nm and the doping density near the bottom of the well is tailored to ensure that the depletion region at the well to substrate junction does not reach the high defect region. An undoped silicon layer, thinner than 30 nm, is epitaxially grown onto the relaxed $Si_{1-x}Ge_x$. This layer of silicon is under biaxial tensile strain, and exhibits high electron and hole mobility. Shallow trenches (STI) are used for device isolation. The STI is formed at low temperatures, preferred no higher than 800° C. The depth of STI is typically deeper than the high defect region. That is, the STI region is slightly deeper than the projected depth of hydrogen ion implantation. The STI may, or may not be deeper then the depth of n- or p-well. The remainder of the CMOS device is fabricated with any low temperature state-of-the-art CMOS process. The high defect regions act as a gettering source to reduce the source and drain junction leakage currents.

Using the present invention structure, the junction depletion region cannot reach into the high defect region. On the other hand, the high defect region is very close to all p-n junctions of the CMOS transistors, such as source and drain junctions, as well as the well junctions. The high defect region acts as a gettering source. Therefore, low junction leakage current can be obtained.

Figure 5A:
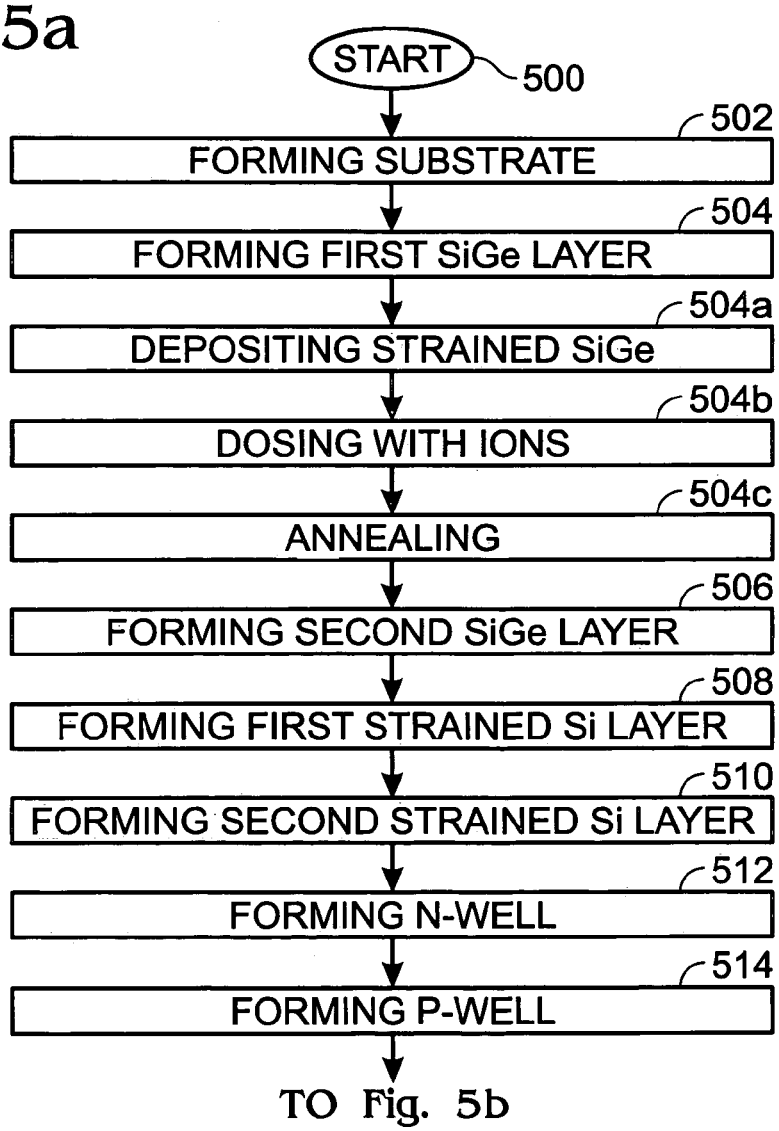
FIGS. 5a and 5b are flowcharts illustrating the present invention method for forming thin silicon germanium (SiGe) dislocation regions in a dual gate CMOSFET device.
Figure 5B:
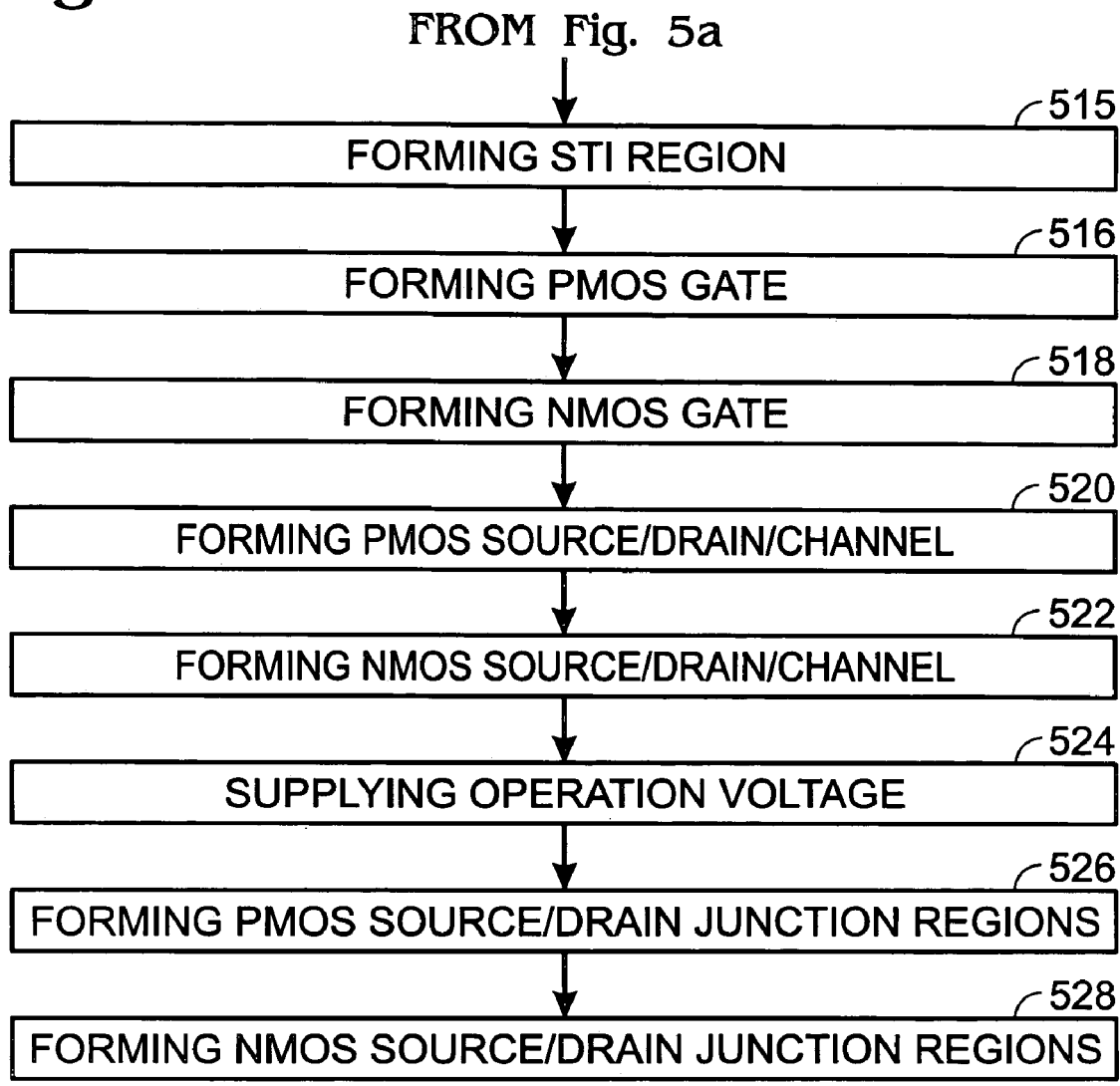

FIGS. 5a and 5b are flowcharts illustrating the present invention method for forming thin silicon germanium (SiGe) dislocation regions in a dual gate CMOSFET device. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 500. Step 502 forms a silicon substrate. Step 504 forms a first layer of relaxed SiGe overlying the substrate, having a thickness of less than 5000 Å. Step 506 forms a second layer of relaxed SiGe overlying the substrate and adjacent to the first layer of SiGe, having a thickness of less than 5000 Å. As mentioned earlier, Steps 504 and 506 are typically performed simultaneously. In some aspects, forming first and second layers of relaxed SiGe includes forming SiGe with a germanium content in the range of 10% to 50%. The SiGe may have the same Ge content throughout the layer thickness, or it may have a concentration gradient. Step 508 forms a first layer of strained-Si overlying the first SiGe layer. Step 510 forms a second layer of strained-Si overlying the second SiGe layer. Step 512 forms an n-doped well (n-well) in the substrate and the overlying first layer of SiGe. Step 514 forms a p-doped well (p-well) in the substrate and the overlying second layer of SiGe. Following Steps 512 and 514, Step 515 forms a shallow trench isolation region interposed between the first SiGe layer and the second SiGe layer. In some aspects of the method, the STI region is formed after the deposition of strained-Si in Steps 508 and 510. Step 516 forms a PMOS gate overlying the first strained-Si layer. Step 518 forms an NMOS gate overlying the second strained-Si layer. Note that Steps 516 and 518 are simultaneous processes. Step 520 forms PMOS transistor source, drain, and channel regions. Step 522 forms NMOS transistor source, drain, and channel regions.

Forming first and second layers of relaxed SiGe in Steps 504 and 506 include substeps. Typically, the corresponding substeps in Steps 504 and 506 are performed simultaneously. However, in the interest of brevity, only one set of substeps are explicitly shown in the figure. Step 504a (506a) deposits strained-SiGe overlying the substrate. Step 504b (506b), using damage-producing ions such as hydrogen ions (H+ or ionized atomic hydrogen), H2 (singly ionized molecular hydrogen), He+, or boron ions, doses to a depth approximately at the interface of the strained-SiGe and the underlying substrate. Step 504c (506c) anneals, relaxing the strained-SiGe.

In some aspects, the annealing process in Steps 504c and 506c forms a first high defect region between the first SiGe layer and the underlying substrate, and second high defect region between the second SiGe layer and the underlying substrate.

In some aspects of the method, hydrogen ions are used to dose to a depth approximately at the interface of the strained-SiGe and the underlying substrate in Step 504b (506b), dosing in the order of $5\times10^{15}$ to $4\times10^{16}$ per square centimeter. Annealing in Step 504c (506c) includes heating to a temperature in the range of 600 to 1000 degrees C. for a time in the range of 1 to 60 minutes.

In some aspects of the method, forming a p-well in the substrate and the overlying second layer of SiGe in Step 514 includes implanting boron to a depth below the second high defect region. Likewise, forming an n-well in the substrate and the overlying first layer of SiGe in Step 512 includes implanting phosphorous ions to a depth below the first high defect region.

In other aspects, forming first and second layers of strained-Si overlying the first and second SiGe layers, respectively, in Steps 508 and 510 includes epitaxially growing undoped Si having thicknesses of less than 300 Å.

In some aspects, forming a STI region interposed between the first SiGe layer and the second SiGe layer in Step 515 includes forming the STI region interposed between the first high defect region and the second high defect region. In other aspects, forming a STI region interposed between the first high defect region and the second high defect region includes forming the STI region interposed between the n-well and the p-well. In yet other aspects, the STI region completely isolates the n-well from the p-well. Typically, Step 515 includes forming the STI at a temperature of 800 degrees C., or less. In some aspects, Step 515 includes forming the STI region to a depth (as defined above in the description of FIG. 1) in the range of 0.2 to 0.6 microns.

Some aspects of the method include further steps. Step 524 supplies a drain, source, gate, and substrate voltage to the completed NMOS and PMOS devices. The above-mentioned voltages are within conventional CMOS operation levels. In response to the operation voltages, Step 526 forms source/drain junction regions between the PMOS source/drain and the first SiGe layer, and forms drain depletion regions into the first SiGe layer. Likewise (in response to the drain voltage of Step 524), Step 528 forms source/drain junction regions between NMOS source/drain and the second SiGe layer, and forms drain depletion regions into the second SiGe layer. Then, it can be stated that Steps 504 and 506 have formed the first and second SiGe layers to a minimum thickness equal to the depth of the source/drain junctions plus the drain depletion region.

A dual gate CMOSFET device with thin SiGe regions, and a method for fabricating the same have been provided. Some details have been given as exemplary means of forming the SiGe regions, the STI regions, and supporting structures. However, other processes could be used to achieve comparable results. Although surface channel MOS transistors have been specifically described, the present invention techniques are equally applicable to buried channel MOS transistors. Other variations and embodiments of the invention will occur to those skilled in the art.

We claim:

1. In a dual gate CMOSFET device, a method for forming thin silicon germanium (SiGe) dislocation regions, the method comprising:
   forming a silicon substrate;
   forming a first layer of relaxed SiGe overlying the substrate, having a thickness of less than 5000 Å;
   forming a second layer of relaxed SiGe overlying the substrate and adjacent to the first layer of relaxed SiGe, having a thickness of less than 5000 Å;
   forming a first layer of strained-Si overlying the first layer of relaxed SiGe;
   forming a second layer of strained-Si overlying the second layer of relaxed SiGe;
   forming an n-doped well (n-well) in the substrate and the overlying first layer of relaxed SiGe; and,
   forming a p-doped well (p-well) in the substrate and the overlying second layer of relaxed SiGe.

2. The method of claim of 1 further comprising:
   forming a PMOS gate overlying the first strained-Si layer;
   forming an NMOS gate overlying the second strained-Si layer;
   forming PMOS transistor source, drain, and channel regions; and,
   forming NMOS transistor source drain, and channel regions.

3. The method of claim 2 further comprising:
   forming a shallow trench isolation (STI) region interposed between the first layer of relaxed SiGe and the second layer of relaxed SiGe.

4. The method of claim 3 wherein forming the first and the second layers of relaxed SiGe includes forming SiGe with a germanium content selected from the group including a constant Ge content and a graded Ge content in the range of 10% to 50%.

5. The method of claim 3 wherein forming the first and the second layers of relaxed SiGe includes:
   depositing strained-SiGe overlying the substrate;
   using damage-producing ions selected from the group including hydrogen ions (H+), H2, He+, and boron ions, dosing to a depth approximately at the interface of the strained-SiGe and the underlying substrate; and,
   annealing and relaxing the strained-SiGe.

6. The method of claim 5 wherein the annealing includes forming a first high defect region between the first layer of relaxed SiGe and the underlying substrate, and second high defect region between the second layer of relaxed SiGe and the underlying substrate.

7. The method of claim 6 wherein using the damage-producing ions to dose to a depth approximately at the interface of the strained-SiGe and the underlying substrate includes using the hydrogen ions (H+) in the order of $5\times10^{15}$ to $4\times10^{16}$ per square centimeter; and,
   where the annealing includes heating to a temperature in the range of 600 to 1000 degrees C. for a time in the range of 1 to 60 minutes.

8. The method of claim 6 wherein forming the n-well in the substrate and the overlying first layer of relaxed SiGe includes implanting phosphorous to a depth below the first high defect region; and,
   wherein forming the p-well in the substrate and the overlying second layer of relaxed SiGe includes implanting boron ions to a depth below the second high defect region.

9. The method of claim 6 wherein forming the STI region interposed between the fast layer of relaxed SiGe and the second layer of relaxed SiGe includes forming the STI region interposed between the first high defect region and the second high defect region.

10. The method of claim 9 wherein forming the STI region interposed between the first high defect region and the second high defect region includes forming the STI region interposed between the n-well and the p-well.

11. The method of claim 9 wherein forming the STI region interposed between the first high defect region and the second high defect region includes forming the STI region to a depth in the range of 0.2 to 0.6 microns.

12. The method of claim 6 wherein forming the STI region interposed between the first layer of relaxed SiGe and the second layer of relaxed SiGe includes forming the STI at a temperature of 800 degrees C. or less.

13. The method of claim 5 wherein forming the first and the second layers of strained-Si overlying the first and the second layers of relaxed SiGe layers, respectively, includes epitaxially growing undoped Si having thicknesses of less than 300 Å.

14. The method of claim 2 further comprising:
supplying drain, source, gate, and substrate operation voltages to the NMOS and PMOS devices;
forming source/drain junction regions between the PMOS source/drain and the first layer of relaxed SiGe, and forming a PMOS drain depletion region in the first layer of relaxed SiGe;
forming source/drain junction regions between the NMOS source/drain and the second layer of relaxed SiGe, and forming an NMOS drain depletion region in the second layer of relaxed SiGe; and,
wherein forming the first and the second layers of relaxed SiGe includes forming the first and the second layers of relaxed SiGe to a minimum thickness equal to the depth of the source/drain junctions plus the NMOS and PMOS drain depletion regions.

* * * * *